United States Patent
Lee et al.

(10) Patent No.: US 8,283,709 B2
(45) Date of Patent: Oct. 9, 2012

(54) SEMICONDUCTOR STRUCTURE

(75) Inventors: Tzung Han Lee, Taipei (TW);
Chung-Lin Huang, Taoyuan County (TW); Hsien-Wen Liu, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 0 days.

(21) Appl. No.: 12/899,721

(22) Filed: Oct. 7, 2010

(65) Prior Publication Data

US 2012/0012905 A1    Jan. 19, 2012

(30) Foreign Application Priority Data

Jul. 16, 2010 (TW) ................................ 99123460 A

(51) Int. Cl.
*H01L 29/772* (2006.01)
(52) U.S. Cl. ........ 257/288; 257/500; 257/118; 257/244; 257/328; 257/333; 257/466; 257/513; 257/594; 257/E29.242; 257/E21.4
(58) Field of Classification Search .................. 257/288, 257/500, 118, 244, 328, 333, 466, 513, 594, 257/E29.242, E21.4
See application file for complete search history.

(56) References Cited

U.S. PATENT DOCUMENTS

| | | | | |
|---|---|---|---|---|
| 6,090,655 A | * | 7/2000 | Zahurak et al. | 438/239 |
| 6,403,412 B1 | * | 6/2002 | Economikos et al. | 438/238 |
| 2006/0237817 A1 | * | 10/2006 | Park | 257/500 |
| 2007/0015343 A1 | * | 1/2007 | Chung et al. | 438/462 |
| 2007/0015347 A1 | * | 1/2007 | Mehta et al. | 438/514 |

* cited by examiner

*Primary Examiner* — Marc Armand
(74) *Attorney, Agent, or Firm* — Rosenberg, Klein & Lee

(57) ABSTRACT

A semiconductor device is disclosed which includes a silicide substrate, a nitride layer, two STIs, and a strain nitride. The silicide substrate has two doping areas. The nitride layer is deposited on the silicide substrate. The silicide substrate and the nitride layer have a recess running through. The two doping areas are at two sides of the recess. The end of the recess has an etching space bigger than the recess. The top of the silicide substrate has a fin-shaped structure. The two STIs are at the two opposite sides of the silicide substrate (recess). The strain nitride is spacer-formed in the recess and attached to the side wall of the silicide substrate, nitride layer, two STIs. The two doping areas cover the strain nitride. As a result, the efficiency of semiconductor is improved, and the drive current is increased.

8 Claims, 5 Drawing Sheets

SEMICONDUCTOR STRUCTURE

BACKGROUND OF THE INVENTION

1. Field of the Invention

The present invention relates to a semiconductor device, and, more specifically but not exclusively, relates to a semiconductor device and a manufacturing method for improving the recess array order as well as increasing the drive current.

2. Description of Related Art

Metal-Oxide-Semiconductor Field-Effect Transistor (MOSFET) is one of the most common and widely used transistors today. Like that of a conventional transistor, the electric current flowing through MOSFET follows along the channels around the interface; and the conduction of electric current is due to the carrier conduction. With the small size development of semiconductor device, the transistor fabrication steps also have lots of improvement for manufacturing small size transistors with high quality. In self-aligned silicide fabrication, it is very common to have metal silicide located at the silicide substrate since the source/drain are excessive consumed. This will not only damage the lattice structure of the source and drain areas but also have leakage since the PN junction sandwiched between the silicide substrate and the source/drain is too close to the metal silicide and further results in element failure.

Please refer to FIG. 1, a conventional MOSFET includes: a silicide substrate 1a, a gate 2a, and two spacers 3a. The silicide substrate having a doping region 11a as the source region and a doping region 12a as the drain section. A gate oxide 13a is formed on the surface of the silicide substrate 1a. The gate 2a locates on the gate oxide 13a. The two spacers 3a separately locate on the two sides of the gate 2a and on the gate oxide 13a. The silicide substrate 1a extensively locating next to both of the sides of the two spacers 3a are separately having a recess. The two recesses 14a separately have an epitaxial layer 4a. Although the epitaxial layer could increase the mobility of electron hole, the fabrication of forming the two recesses 14a would infect the wide of polysilicon wire of the gate 2a and leads to insufficient drive current. Therefore, this will hurt the effectiveness of MOSFET.

SUMMARY OF THE INVENTION

For further understanding of the invention, reference is made to the following detailed description illustrating the embodiments and examples of the invention. The description is only for illustrating the invention, not for limiting the scope of the claim.

The current invention mainly providing a semiconductor device structure and a manufacture method which could greatly increase the drive current of semiconductor and promote the operating efficiency as well as reduce the leakage generating.

For achieving the aforementioned objective, the current invention providing a semiconductor structure includes: a silicide substrate having two doping areas, and a nitride layer locating on the silicide substrate. A recess goes through the nitride layer silicide and the silicide substrate. The two doping areas separately locate on the side of the recess. One side of the recess forms an etching space which size is bigger than the recess. The top of the silicide substrate forms a projection. Two shallow trench isolation areas locate on opposite side of the silicide substrate and the recess. A strained nitride coating locates in the recess and attaches with the silicide substrate, the nitride layer and the side wall of the two shallow trench isolation areas. The two doping areas cover the strained nitride coating.

The current invention providing a manufacturing method of a semiconductor device structure includes the following steps: providing a stack structure having a silicide substrate, a nitride layer and a hard mask layer. The hard mask layer condensed on the nitride layer. Etching the hard mask layer, the nitride layer and the silicide substrate are to form a recess. The two opposite sides of the recess form two shallow trench isolation areas. A strained nitride coating in the recess attaches with side walls of the silicide substrate and the nitride layer. Wet etching the silicide substrate at the bottom of the recess forms an etching space which size is bigger than the recess. Then, removing the hard mask layer, parts of the etching locates on the two sides of the shallow trench isolation areas at the silicide substrate so that the top of the silicide substrate forms a projection. Moreover, the silicide substrate on the two side walls of the recess forms two doping areas. The two doping areas cover the strained nitride coating.

The current invention of the semiconductor device structure and manufacturing method has the following beneficial effect.

1. The strained nitride coating in the recess attaches with the side wall of the silicide substrate, nitride layer and the two shallow trench isolation areas. The two doping areas cover the strained nitride coating. Thus, the strained nitride coating could change the distance between two Silicon atoms of the two doping areas and increase the electron hole mobility as well as further promoting the operating efficiency of the semiconductor device.

2. One side of the recess forms an etching space which size is bigger than the recess. The top of the suicide substrate forms a projection which could increase the channel distance between the source and the strain and further increase the drive current as well as decrease the leakage happening.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompany drawings, wherein like reference numerals refer to like parts throughout the various views unless otherwise specified.

DETAILED DESCRIPTION OF THE PREFERRED EMBODIMENTS

Figure 1:
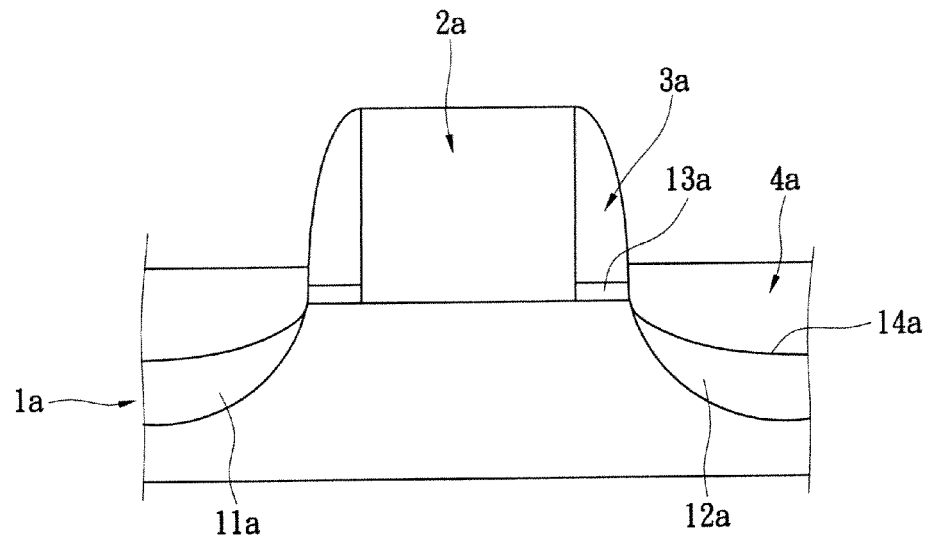
FIG. 1 illustrates the conventional semiconductor device sectional view schematic diagram.
Figure 2:
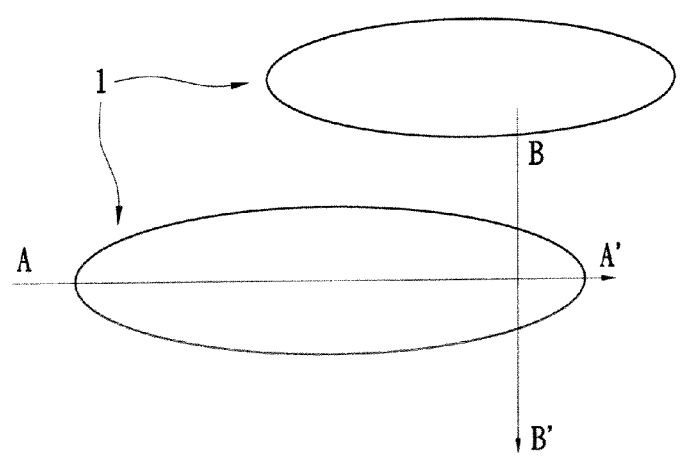
FIG. 2 illustrates the partial overlook schematic diagram in accordance with the current invention.
Figure 3:
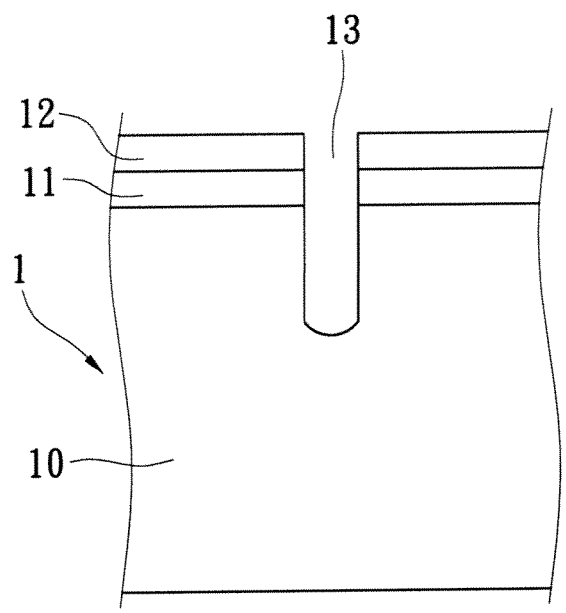
FIG. 3 illustrates the sectional schematic diagram of the manufacturing steps based on the section line A-A in FIG.

Please refer to the FIG. 2 to FIG. 10; FIG. 2 is the partial overlook schematic diagram in accordance with the current invention. FIG. 3 to FIG. 10 illustrates the manufacturing steps by using the section line A-A and B-B in the FIG. 2. The manufacturing method of the semiconductor device structure in the current invention could be implemented on the transistor of Random Access Memory (RAM) and greatly increase the drive current of the transistor for promoting the operating efficiency of the transistor. Please refer to FIG. 3, FIG. 3 is the sectional view diagram of manufacturing steps based on the section line A-A of the FIG. 2. First of all, a stacked structure is provided which includes a silicide substrate 10, a nitride layer 11 and a hard mask layer 12. In current embodiment, the nitride layer is nitride condensed on the silicide substrate 11. Etching the hard mask layer 12, nitride layer 11 and silicide substrate 10, the etching depth of the recess on the nitride substrate around 80 nm, is to form a recess 13.

Figure 4:
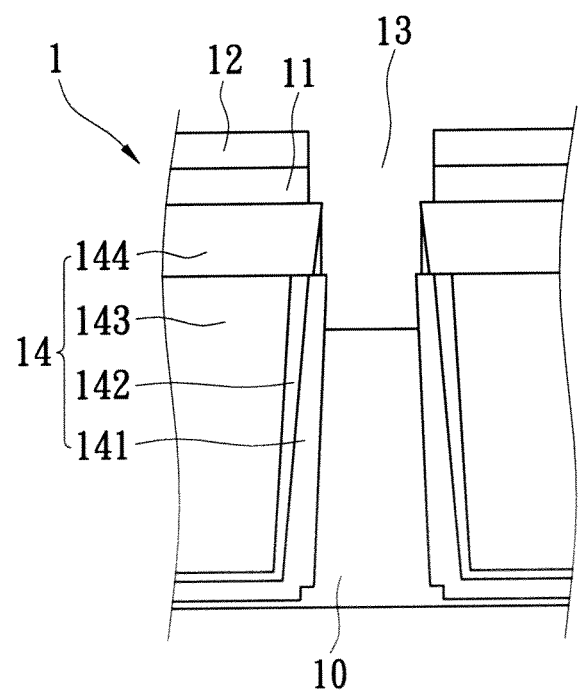
FIG. 4 illustrates the sectional schematic diagram of the manufacturing steps based on the section line B-B in FIG. 2.

Please refer FIG. 4; FIG. 4 is the sectional view diagram of manufacturing steps based on the section line B-B of the FIG. 2. Two shallow trench isolation areas 14 are formed on the two opposite sides of the recess 13 and the silicide substrate 10. The shallow trench isolation area locates in the middle of the two semiconductors 1 for isolating two semiconductors. The steps for forming the two shallow trench isolation areas 14 are: A OX liner 141, a strain SiN liner 142, a SOD 143 and a HDP 144 condensed in order on the opposite sides of the recess 13 and the silicide substrate 10. The two OX liners 141 locate on the two sides of the silicide substrate 10. The strain SiN liner 142 locates on the OX liner 141 for being the etching barrier. The SOD 143 locating on the strain SiN liner 142 has excellent capability of gap filling. The HDP 144 locates on the SOD 143 and the nitride layer 11 locates on the HDP 144.

Figure 5:
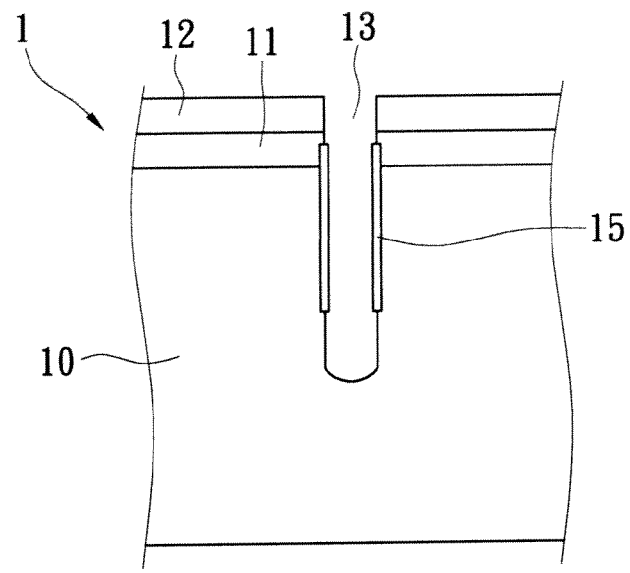
FIG. 5 illustrates the sectional schematic diagram of the manufacturing steps based on the section line A-A in FIG. 2.
Figure 6:
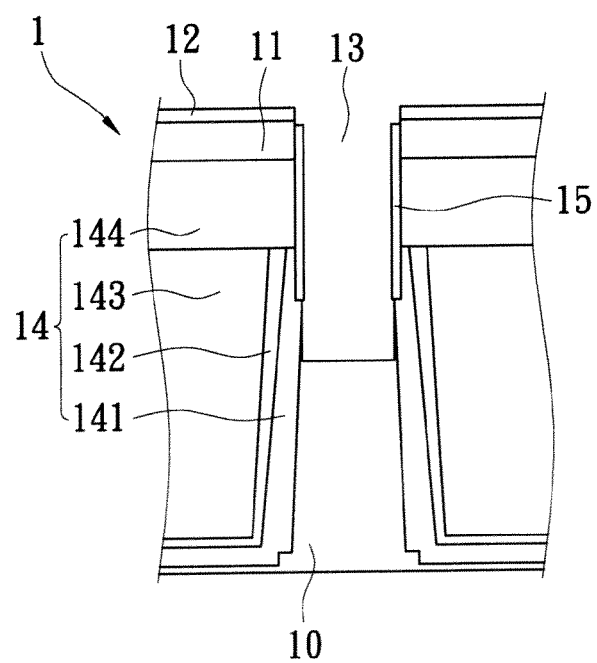
FIG. 6 illustrates the sectional schematic diagram of the manufacturing steps based on the section line B-B in FIG. 2.

Please refer FIG. 5 and FIG. 6, the sectional view diagram of manufacturing steps based on the section line A-A and the section line B-B of the FIG. 2, a strained nitride coating 15 forms in the recess 13. In current embodiment, the strained nitride coating 15 is a strain SiN liner. The steps of forming the strained nitride coating 15 are the followings. First of all, a strained nitride coating condensed on the hard mask layer 12 and the recess 13 by chemical vapor depositing. Then, etching the strained nitride coating locating at the bottom of the hard mask layer and recess 13. The rest of the strained nitride coating 15 attaches on the silicide substrate 10, strained nitride coating 11 and side wall of two shallow trench areas 14. Then, etching deeper to the bottom of the recess 13 of the silicide substrate to the depth around 50 nm.

Figure 7:
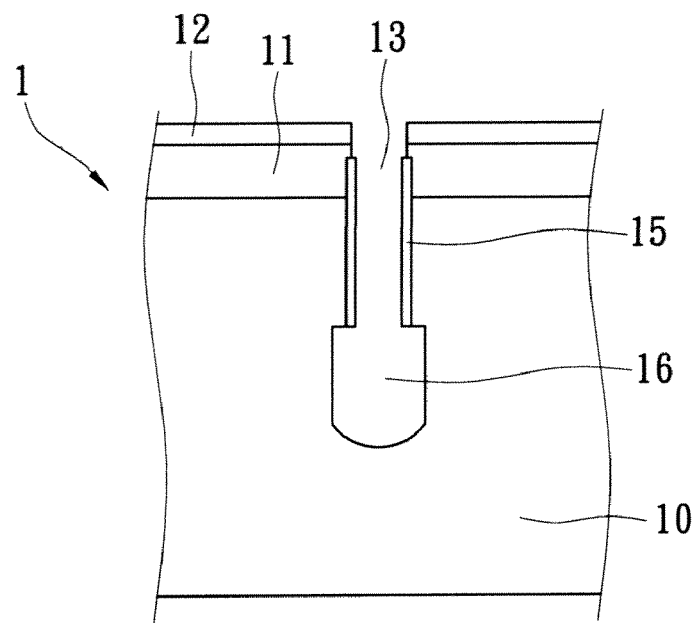
FIG. 7 illustrates the sectional schematic diagram of the manufacturing steps based on the section line A-A in FIG. 2.
Figure 8:
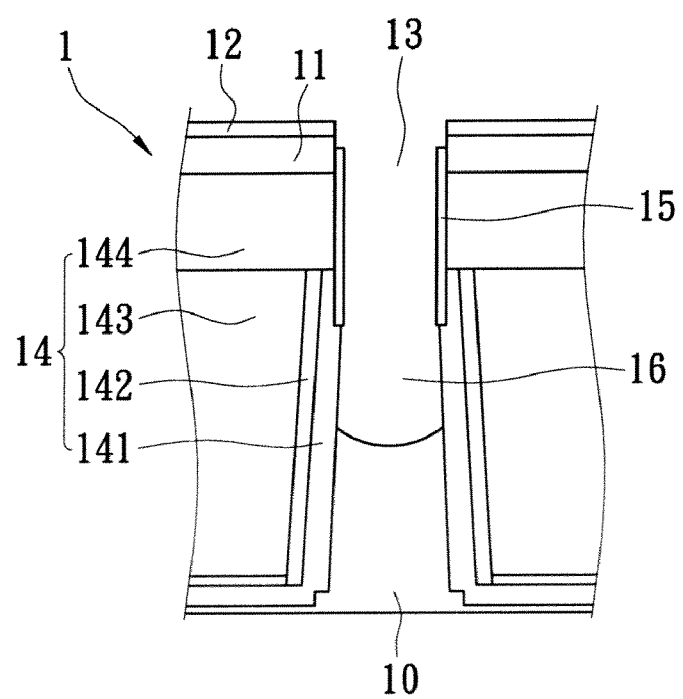
FIG. 8 illustrates the sectional schematic diagram of the manufacturing steps based on the section line B-B in FIG. 2.
Figure 9:
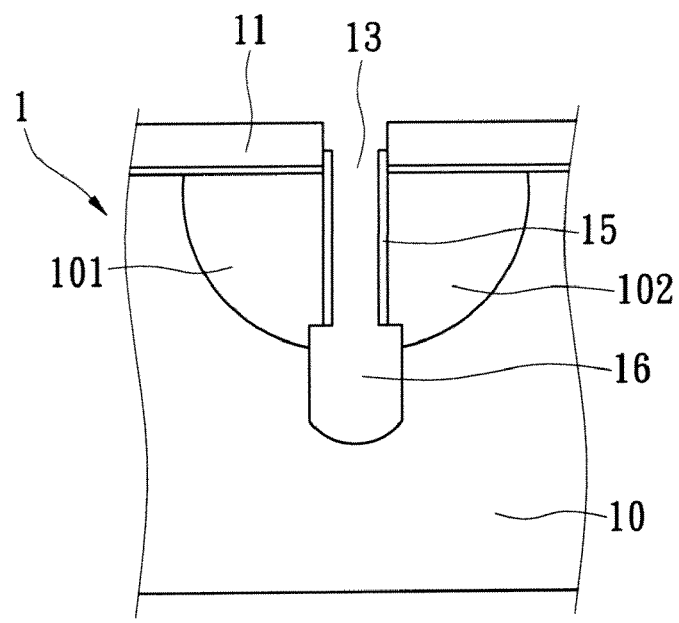
FIG. 9 illustrates the sectional schematic diagram of the manufacturing steps based on the section line A-A in FIG. 2.
Figure 10:
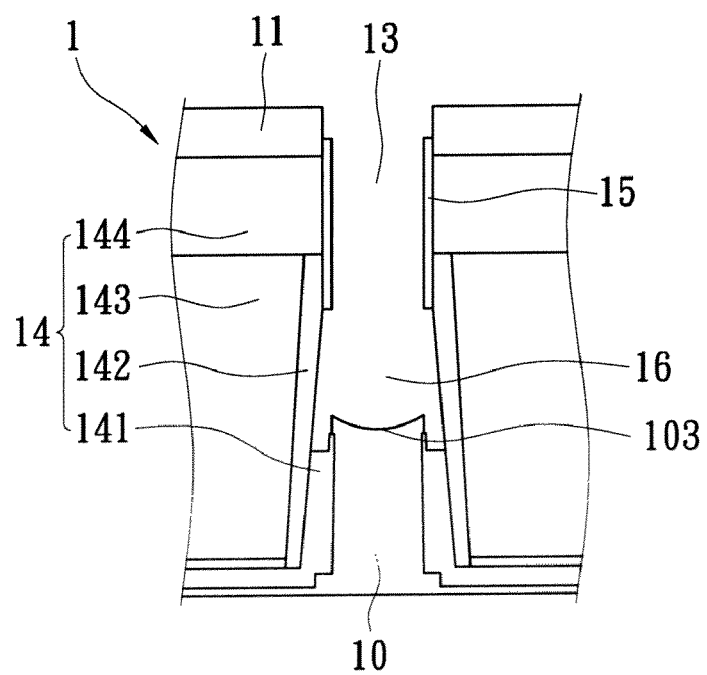
FIG. 10 illustrates the sectional schematic diagram of the manufacturing steps based on the section line B-B in FIG. 2.

Please refer to FIG. 7 and FIG. 8, the sectional view diagram of manufacturing steps based on the section line A-A and the section line B-B of the FIG. 2. Wet etching the silicide substrate 10 of the recess 13 for forming an etching space 16 which size is bigger than the recess 13. In current embodiment, the cross-section of the etching space is bottle shape but could be ball shape or drop shape which has no limits of the shape design Please refer to the FIG. 9, FIG. 10, FIG. 7 and FIG. 8, the sectional view diagram of manufacturing steps based on the section line A-A and the section line B-B of the FIG. 2. First of all, removing the hard mask layer 12 and partially etching the OX liner 141 locating on the two shallow trench isolation areas 14 locating on the two sides of the silicide substrate 10 so that the column cross section of the top of the silicide substrate 10 is formed a fin-shaped projection 103. Then, creating two doping areas 101 and 102 as source and drain using ion implantation on the two sides of the silicide substrate of the recess 13 which the two doping area 101 and 102 cover the strained nitride coating 15. The strained nitride coating 15 could change the distance between two silicon atoms and increase the mobility of electron hole as well as further promote the operating efficiency. Moreover, it is worth to mention that the recess 13 and etching space 16 could further condense N+Poly as the gate which is not shown in the FIG.

The current invention providing another semiconductor device structure includes: silicide substrate 10, nitride layer 11, the side wall of the two shallow trench isolation areas 14 and a strained nitride coating 15.

The semiconductor device structure and the manufacture method have the following advantages.

1. The strained nitride coating 15 is disposed on the side wall that defines the recess structure 13 on the silicide substrate 10, partially covering the nitride layer 11 and the two shallow trench isolation areas 14. The two doping areas 101 and 102 are also covered by the strained nitride coating 15. Thus, the strained nitride coating 15 could change the distance between two Silicon atoms of the two doping areas and increase the electron hole mobility as well as further promoting the operating efficiency of the semiconductor device.

2. One side of the recess 13 forms an etching space 16 which size is bigger than the recess 13. The top of the silicide substrate 10 forms a projection 103 which could increase the channel distance between the source and the strain and further increase the drive current as well as decrease the leakage happening.

Some modifications of these examples, as well as other possibilities will, on reading or having read this description, or having comprehended these examples, will occur to those skilled in the art. Such modifications and variations are comprehended within this invention as described here and claimed below. The description above illustrates only a relative few specific embodiments and examples of the invention. The invention, indeed, does include various modifications and variations made to the structures and operations described herein, which still fall within the scope of the invention as defined in the following claims.

What is claimed is:
1. A semiconductor structure comprising:
I. a silicide substrate having two doping areas;
II. a nitride layer disposed on the silicide substrate,
  (a) the nitride layer and the silicide substrate having a recess structure formed thereon, the doping areas of the silicide substrate are respectively arranged on the opposite sides of the recess structure,
  (b) the silicide substrate defines an etched space therein communicative with the lower end of the recess structure, the etched space having a cross section greater than that of the recess structure,
  (c) a protruding structure exposingly formed in the etched space on the silicide substrate;
III. a pair of trench isolation areas disposed on the opposite sides of the silicide substrate and the recess (along the long symmetrical axis), wherein each trench isolation areas having a overlaying structure comprising an OX liner, a strain SiN liner, a SOD, and a HDP disposed from bottom to top in the above order; and
IV. a strained nitride coating disposed on the side wall that defines the recess structure covering the doping areas of the silicide substrate.

2. The semiconductor structure of claim 1, wherein the strained nitride coating is a strained SiN liner.

3. The semiconductor structure of claim 1, wherein the cross-section of the etching space is of a bottle shape.

4. The semiconductor structure of claim 1, wherein the protruding structure is fin-shaped.

5. A semiconductor structure comprising:
   I. a silicide substrate having a top surface and two doping areas formed thereon;
   II. a nitride layer disposed on the top surface of silicide substrate, wherein
      (a) a recess structure is formed into the nitride layer and the silicide substrate, the recess structure having a long symmetrical axis and a short symmetrical axis, wherein the doping areas of the silicide substrate are respectively arranged on the opposite sides of the recess structure above the bottom portion thereof and expose from the respective side walls of the recess structure,
      (b) the silicide substrate defines an etched space therein at the bottom portion of the recess structure, the etched space having a cross section wider than that of the recess structure,
      (c) a protruding structure is exposingly formed in the etched space on the silicide substrate at the bottom surface of the recess structure;
   III. a pair of trench isolation areas disposed on the opposite sides of the silicide substrate and the recess along the long symmetrical axis, wherein each trench isolation areas having an overlying structure comprising an OX liner, a strain SiN liner, a SOD, and a HDP disposed from bottom to top in the above order; and
   IV. a strained nitride coating selectively disposed on the side wall that defines the recess structure and covering the exposed portion of the doping area on the side wall of the recess structure above the bottom portion thereof.

6. The semiconductor structure of claim 1, wherein the the strained nitride coating is a strained SiN liner.

7. The semiconductor structure of claim 1, wherein the cross-section of the etching space is of a bottle shape.

8. The semiconductor structure of claim 1, wherein the protruding structure is fin-shaped.

* * * * *